United States Patent
Rozin et al.

(10) Patent No.: US 9,977,601 B2
(45) Date of Patent: May 22, 2018

(54) DATA LOAD FOR SYMMETRICAL FILTERS

(71) Applicant: Ceva D.S.P. Ltd., Herzlia Pituach (IL)

(72) Inventors: Hagay Rozin, Raanana (IL); Jeffrey Allan (Alon) Jacob (Yaakov), Raanana (IL)

(73) Assignee: Ceva D.S.P. Ltd., Herzlia Pituach (IL)

( * ) Notice: Subject to any disclaimer, the term of this patent is extended or adjusted under 35 U.S.C. 154(b) by 118 days.

(21) Appl. No.: 15/073,103

(22) Filed: Mar. 17, 2016

(65) Prior Publication Data

US 2017/0269832 A1    Sep. 21, 2017

(51) Int. Cl.
*G06F 3/06* (2006.01)
*H03H 17/06* (2006.01)

(52) U.S. Cl.
CPC ............ *G06F 3/061* (2013.01); *G06F 3/0659* (2013.01); *G06F 3/0673* (2013.01); *H03H 17/06* (2013.01)

(58) Field of Classification Search
CPC ...................................................... H03H 17/06
See application file for complete search history.

(56) References Cited

U.S. PATENT DOCUMENTS

| 5,027,423 | A | 6/1991 | Kawata et al. |
| 6,279,020 | B1 * | 8/2001 | Dujardin ............ H03H 17/0294 708/316 |
| 7,400,781 | B2 | 7/2008 | Kyo |
| 8,346,833 | B2 | 1/2013 | Lin et al. |
| 2013/0091339 | A1 * | 4/2013 | Van Kampen .......... G06F 7/785 712/4 |
| 2014/0219577 | A1 | 8/2014 | Hayashi |
| 2016/0328233 | A1 * | 11/2016 | Van Dalen ............ G06F 9/3001 |

* cited by examiner

*Primary Examiner* — Chuong D Ngo
(74) *Attorney, Agent, or Firm* — Pearl Cohen Zedek Latzer Baratz LLP (57) ABSTRACT

A system and method for symmetrical filtering of an input string may include loading, into at least one vector register, in a single read cycle, a subset of right-side data elements and a subset of left-side data elements of the input string. The input string may be stored sequentially in a memory unit. The right-side data elements and the left-side data elements may be equally distant from the center of the input string and may be separated by a whole number of rows in the memory. The system and method may include performing filtering of the input string using a symmetrical filter with the loaded right-side data elements and left-side data elements.

18 Claims, 8 Drawing Sheets

| | V8[4..7] | | | | V9 | | | | | | | | V10 | | | | | | | | V11[0..3] | | | |
|---|---|---|---|---|---|---|---|---|---|---|---|---|---|---|---|---|---|---|---|---|---|---|---|---|
| | 4 | 5 | 6 | 7 | 0 | 1 | 2 | 3 | 4 | 5 | 6 | 7 | 0 | 1 | 2 | 3 | 4 | 5 | 6 | 7 | 0 | 1 | 2 | 3 |
| cycle -2 | x | x | x | x | x | x | x | x | x | x | x | x | x | x | x | x | x | x | x | x | x | x | x | x |
| cycle -1 | 28 | 29 | 30 | 31 | x | x | x | x | x | x | x | x | x | x | x | x | x | x | x | x | x | x | x | x |
| cycle 0 | 28 | 29 | 30 | 31 | 32 | 33 | 34 | 35 | 36 | 37 | 38 | 39 | x | x | x | x | 36 | 37 | 38 | 39 | 40 | 41 | 42 | 43 |
| cycle 1 | x | 28 | 29 | 30 | 31 | 32 | 33 | 34 | 35 | 36 | 37 | 38 | 33 | 34 | 35 | 36 | 37 | 38 | 39 | 40 | 40 | 41 | 42 | 43 |
| cycle 2 | x | x | 28 | 29 | 30 | 31 | 32 | 33 | 34 | 35 | 36 | 37 | 34 | 35 | 36 | 37 | 38 | 39 | 40 | 41 | 41 | 42 | 43 | x |
| cycle 3 | x | x | x | 28 | 29 | 30 | 31 | 32 | 33 | 34 | 35 | 36 | 35 | 36 | 37 | 38 | 39 | 40 | 41 | 42 | 42 | 43 | x | x |
| cycle 4 | 24 | 25 | 26 | 27 | 28 | 29 | 30 | 31 | 32 | 33 | 34 | 35 | 36 | 37 | 38 | 39 | 40 | 41 | 42 | 43 | 43 | x | x | x |
| cycle 5 | x | 24 | 25 | 26 | 27 | 28 | 29 | 30 | 31 | 32 | 33 | 34 | 37 | 38 | 39 | 40 | 41 | 42 | 43 | 44 | 44 | 45 | 46 | 47 |
| cycle 6 | x | x | 24 | 25 | 26 | 27 | 28 | 29 | 30 | 31 | 32 | 33 | 38 | 39 | 40 | 41 | 42 | 43 | 44 | 45 | 45 | 46 | 47 | x |
| cycle 7 | x | x | x | 24 | 25 | 26 | 27 | 28 | 29 | 30 | 31 | 32 | 39 | 40 | 41 | 42 | 43 | 44 | 45 | 46 | 46 | 47 | x | x |
| cycle 8 | 20 | 21 | 22 | 23 | 24 | 25 | 26 | 27 | 28 | 29 | 30 | 31 | 40 | 41 | 42 | 43 | 44 | 45 | 46 | 47 | 47 | x | x | x |
| cycle 9 | x | 20 | 21 | 22 | 23 | 24 | 25 | 26 | 27 | 28 | 29 | 30 | 41 | 42 | 43 | 44 | 45 | 46 | 47 | 48 | 48 | 49 | 50 | 51 |
| cycle 10 | x | x | 20 | 21 | 22 | 23 | 24 | 25 | 26 | 27 | 28 | 29 | 42 | 43 | 44 | 45 | 46 | 47 | 48 | 49 | 49 | 50 | 51 | x |

| | V8[4..7] | | | | V9 | | | | | | | | V10 | | | | | | | | V11[0..3] | | | |
|---|---|---|---|---|---|---|---|---|---|---|---|---|---|---|---|---|---|---|---|---|---|---|---|---|
| | 4 | 5 | 6 | 7 | 0 | 1 | 2 | 3 | 4 | 5 | 6 | 7 | 0 | 1 | 2 | 3 | 4 | 5 | 6 | 7 | 0 | 1 | 2 | 3 |
| cycle 31 | x | x | x | 0 | 1 | 2 | 3 | 4 | 5 | 6 | 7 | 8 | 63 | 64 | 65 | 66 | 67 | 68 | 69 | 70 | 71 | x | x | x |
| cycle 32 | 36 | 37 | 38 | 39 | 0 | 1 | 2 | 3 | 4 | 5 | 6 | 7 | 64 | 65 | 66 | 67 | 68 | 69 | 70 | 71 | 48 | 49 | 50 | 51 |
| cycle 0 | 36 | 37 | 38 | 39 | 40 | 41 | 42 | 43 | 44 | 45 | 46 | 47 | 40 | 41 | 42 | 43 | 44 | 45 | 46 | 47 | 48 | 49 | 50 | 51 |
| cycle 1 | x | 36 | 37 | 38 | 39 | 40 | 41 | 42 | 43 | 44 | 45 | 46 | 41 | 42 | 43 | 44 | 45 | 46 | 47 | 48 | 49 | 50 | 51 | x |
| cycle 2 | x | x | 36 | 37 | 38 | 39 | 40 | 41 | 42 | 43 | 44 | 45 | 42 | 43 | 44 | 45 | 46 | 47 | 48 | 49 | 50 | 51 | x | x |

Fig. 6

| | v8[4..7] | | | | v9 | | | | | | | | v10 | | | | | | | | v11[0..3] | | | |
|---|---|---|---|---|---|---|---|---|---|---|---|---|---|---|---|---|---|---|---|---|---|---|---|---|
| | 4 | 5 | 6 | 7 | 0 | 1 | 2 | 3 | 4 | 5 | 6 | 7 | 0 | 1 | 2 | 3 | 4 | 5 | 6 | 7 | 0 | 1 | 2 | 3 |
| cycle -2 | 6 | 7 | 8 | 9 | x | x | x | x | x | x | x | x | x | x | x | x | x | x | x | x | 18 | 19 | 20 | 21 |
| cycle -1 | 6 | 7 | 8 | 9 | 10 | 11 | 12 | 13 | 14 | 15 | 16 | 17 | 11 | 12 | 13 | 14 | 15 | 16 | 17 | 18 | 19 | 20 | 21 | x |
| cycle 0 | 6 | 7 | 8 | 9 | 10 | 11 | 12 | 13 | 14 | 15 | 16 | 17 | 11 | 12 | 13 | 14 | 15 | 16 | 17 | 18 | 19 | 20 | 21 | x |
| cycle 1 | x | 6 | 7 | 8 | 9 | 10 | 11 | 12 | 13 | 14 | 15 | 16 | 12 | 13 | 14 | 15 | 16 | 17 | 18 | 19 | 20 | 21 | x | x |
| cycle 2 | x | x | 6 | 7 | 8 | 9 | 10 | 11 | 12 | 13 | 14 | 15 | 13 | 14 | 15 | 16 | 17 | 18 | 19 | 20 | 21 | x | x | x |
| cycle 3 | x | x | x | 6 | 7 | 8 | 9 | 10 | 11 | 12 | 13 | 14 | 14 | 15 | 16 | 17 | 18 | 19 | 20 | 21 | x | x | x | x |
| cycle 4 | 2 | 3 | 4 | 5 | 6 | 7 | 8 | 9 | 10 | 11 | 12 | 13 | 15 | 16 | 17 | 18 | 19 | 20 | 21 | 22 | 23 | 24 | 25 | x |
| cycle 5 | x | 2 | 3 | 4 | 5 | 6 | 7 | 8 | 9 | 10 | 11 | 12 | 16 | 17 | 18 | 19 | 20 | 21 | 22 | 23 | 24 | 25 | x | x |
| cycle 6 | x | x | 2 | 3 | 4 | 5 | 6 | 7 | 8 | 9 | 10 | 11 | 17 | 18 | 19 | 20 | 21 | 22 | 23 | 24 | 25 | x | x | x |
| cycle 7 | x | x | x | 2 | 3 | 4 | 5 | 6 | 7 | 8 | 9 | 10 | 18 | 19 | 20 | 21 | 22 | 23 | 24 | 25 | x | x | x | x |
| cycle 8 | -2 | -1 | 0 | 1 | 2 | 3 | 4 | 5 | 6 | 7 | 8 | 9 | 19 | 20 | 21 | 22 | 23 | 24 | 25 | 26 | 27 | 28 | 29 | x |
| cycle 9 | x | -2 | -1 | 0 | 1 | 2 | 3 | 4 | 5 | 6 | 7 | 8 | 20 | 21 | 22 | 23 | 24 | 25 | 26 | 27 | 28 | 29 | x | x |
| cycle 10 | 14 | 15 | 16 | 17 | 18 | 19 | 20 | 21 | 22 | 23 | 24 | 25 | 21 | 22 | 23 | 24 | 25 | 26 | 27 | 28 | 26 | 27 | 28 | 29 |
| cycle 0 | 14 | 15 | 16 | 17 | 17 | 18 | 19 | 20 | 21 | 22 | 23 | 24 | 19 | 20 | 21 | 22 | 23 | 24 | 25 | 26 | 27 | 28 | 29 | x |
| cycle 1 | x | 14 | 15 | 16 | 16 | 17 | 18 | 19 | 20 | 21 | 22 | 23 | 20 | 21 | 22 | 23 | 24 | 25 | 26 | 27 | 28 | 29 | x | x |
| cycle 2 | x | x | 14 | 15 | 15 | 16 | 17 | 18 | 19 | 20 | 21 | 22 | 21 | 22 | 23 | 24 | 25 | 26 | 27 | 28 | 29 | x | x | x |
| cycle 3 | x | x | x | 14 | 14 | 15 | 16 | 17 | 18 | 19 | 20 | 21 | 22 | 23 | 24 | 25 | 26 | 27 | 28 | 29 | x | x | x | x |
| cycle 4 | 10 | 11 | 12 | 13 | 14 | 15 | 16 | 17 | 18 | 19 | 20 | 21 | 23 | 24 | 25 | 26 | 27 | 28 | 29 | 30 | 31 | 32 | 33 | x |

DATA LOAD FOR SYMMETRICAL FILTERS

FIELD OF THE INVENTION

The present invention relates generally to the field of symmetrical filtering, and more particularly, to loading data for symmetrical filters.

BACKGROUND

Many digital filters, for example finite impulse response (FIR) filters with linear response, are characterized by having a bilaterally symmetric coefficient sequence, e.g., a pair of corresponding right side and left side coefficients that are equally distant from the center of the filter have the same value. It is, therefore, beneficial to use the symmetry property of these filters for more efficient filtering. For example, in many hardware implementations of symmetrical filters, pairs of corresponding right-side and left-side data elements (e.g., data elements that are equally distant from the center of the filter) are first added and only then multiplied by the filter coefficient to save multiplexers.

SUMMARY

According to embodiments of the present invention, there is provided a method and system for symmetrical filtering of an input string which may include: loading, into at least one vector register, in a single read cycle, a subset of right-side data elements and a subset of left-side data elements of the input string, wherein the input string is stored sequentially in a memory unit, wherein the right-side data elements and the left-side data elements are equally distant from the center of the input string; and performing filtering of the input string using a symmetrical filter with the loaded right-side data elements and left-side data elements.

Furthermore, according to embodiments of the present invention, the memory may be a tightly-coupled memory (TCM).

Furthermore, according to embodiments of the present invention, the memory unit may include a plurality of individually addressable memory banks, wherein each data element of the subset of right-side data elements and the subset of left-side data elements may be loaded from a different memory bank.

Furthermore, according to embodiments of the present invention, the subset of right-side data elements may include consecutive data elements and the subset of left-side data elements may include consecutive data elements.

Furthermore, according to embodiments of the present invention, the subset of right-side data elements and the subset of left-side data elements may be separated by a whole number of rows in the memory.

Furthermore, according to embodiments of the present invention, the method and system may include: calculating an address of the right-side data elements based on an address of the left side data element, a width of the memory, the size of a memory element, and a stride length parameter, wherein the stride length parameter is indicative of the number of memory rows separating the subset of left-side data elements and the subset of right-side data elements.

According to embodiments of the present invention, there is provided a method and system for performing a symmetrical filter of a data string, which may include: defining a left initial subset including data elements of an input string stored sequentially in a memory unit, and a right initial subset including data elements corresponding to the data elements of the left initial subset; loading, in a single read cycle, a left-side subset including data elements immediately preceding the left initial subset into a left reservoir register, and a right-side subset including data elements immediately following the right initial subset, into a right reservoir register; loading the left initial subset into a left data register and the right initial subset into a right data register, wherein symmetrical data elements are loaded into corresponding elements of the left data register and right data register; in every clock cycle subsequent to the loading of the left initial subset into the left data register and the right initial subset into the right data register: adding symmetrical data elements of the right data register and the left data register, multiplying the sum by an appropriate filter coefficient and accumulating the results; shifting data elements in left data register and in left reservoir register by one element to the right, wherein the left reservoir register feeds the left data register; and shifting data elements in right data register and in the right reservoir register by one element to the left, wherein the right reservoir register feeds the right data register; if a last data elements in the left reservoir register and in the right reservoir register are feed into the left data register and the right data register, loading, in a single read cycle, next right-side data elements into the right reservoir register and next left-side data elements into the left reservoir register, wherein the left data register, the right data register, the left reservoir register and the right reservoir register are vector registers.

Furthermore, according to embodiments of the present invention, the right initial subset may include a start of the input string.

Furthermore, according to embodiments of the present invention, the symmetrical filter may include odd or even number of coefficients.

Furthermore, according to embodiments of the present invention, the left initial subset may include the center of the filtered string, wherein loading the right initial subset into the right data register may include loading the center of the fileted string into the right data register, and shifting data elements in the right data register and in the right reservoir register by one element to the left, wherein the right reservoir register may feed the right data register, and wherein loading the next right-side data elements into the right reservoir register may include shifting the loaded data elements in the right reservoir register by one element to the left, wherein the right reservoir register may feed the right data register.

Furthermore, according to embodiments of the present invention, the method and system may include calculating an address of the right-side data elements based on an address of the left side data element, a width of the memory, a size of a memory element and a stride length parameter, wherein the stride length parameter may be modified by one for subsequent load cycles of the input string, wherein the stride length parameter may be indicative of the number of memory rows separating the left-side data elements and the right-side data elements.

According to embodiments of the present invention, there is provided a method and system for symmetrical filtering of an input string, which may include: a memory unit including a plurality of individually addressable memory banks a for sequentially storing the input string; at least one vector register; and an execution unit configured to read in a single read cycle a subset of right-side data elements and a subset of left-side data elements of the data string to into the at least one vector register, wherein the right-side data elements and the left-side data elements may be equally distant from the center of the input string.

Furthermore, according to embodiments of the present invention, the memory may be a tightly-coupled memory (TCM).

Furthermore, according to embodiments of the present invention, the memory may include a plurality of individually addressable memory banks, wherein each data element of the subset of right-side data elements and the subset of left-side data elements is loaded from a different memory bank.

Furthermore, according to embodiments of the present invention, the execution unit may be further configured to: calculate an address of the right-side data elements based on an address of the left side data element, a width of the memory, the size of a memory element, and a stride length parameter, wherein the stride length parameter is indicative of the number of memory rows separating the subset of left-side data elements and the subset of right-side data elements.

Furthermore, according to embodiments of the present invention, the execution unit may be further configured to: perform filtering of the input string using a symmetrical filter with the loaded right-side data elements and left-side data elements.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Filtering input samples may be performed for example by the following formula (as with other formulas discussed herein, other or different formulas may be used):

$$y[n]=\Sigma_{k=0}^{N-1}h[k]\cdot x[n-k] \quad \text{(Equation 1)}$$

Where N is the number of taps of the filter, n is an output result number or index, y[n] is an output result no. n, h[k] are the filter coefficients, and x[n−k] are the input samples required for calculating output result y[n]. The symmetry of the coefficients of the filter may be expressed for example by:

$$h[k]=h[N-1-k] \quad \text{(Equation 2)}$$

Embodiments of the present invention provide a method for loading data elements of a string for performing a symmetrical filter. Embodiments of the present invention may in some cases improve the operation of a processor or computer systems by for example reducing the time required for loading data elements required for performing symmetrical filtering, and by this reducing the overall time required for performing the symmetrical filter by the processor. According to embodiments of the present invention, data elements of an input string may be loaded in or during a single read or load cycle, even in the case that their addresses are non-contiguous. Embodiments of the present invention may be utilized for any application requiring symmetrical filtering, for example, for many digital communication applications, audio processing, image processing etc. As used herein, a load or read cycle may refer to a sequence of operations including for example retrieving data from memory, including fetching the data elements from the required memory address, and storing the fetched data elements in internal registers (e.g., vector registers 150 depicted in FIG. 1).

Figure 1:
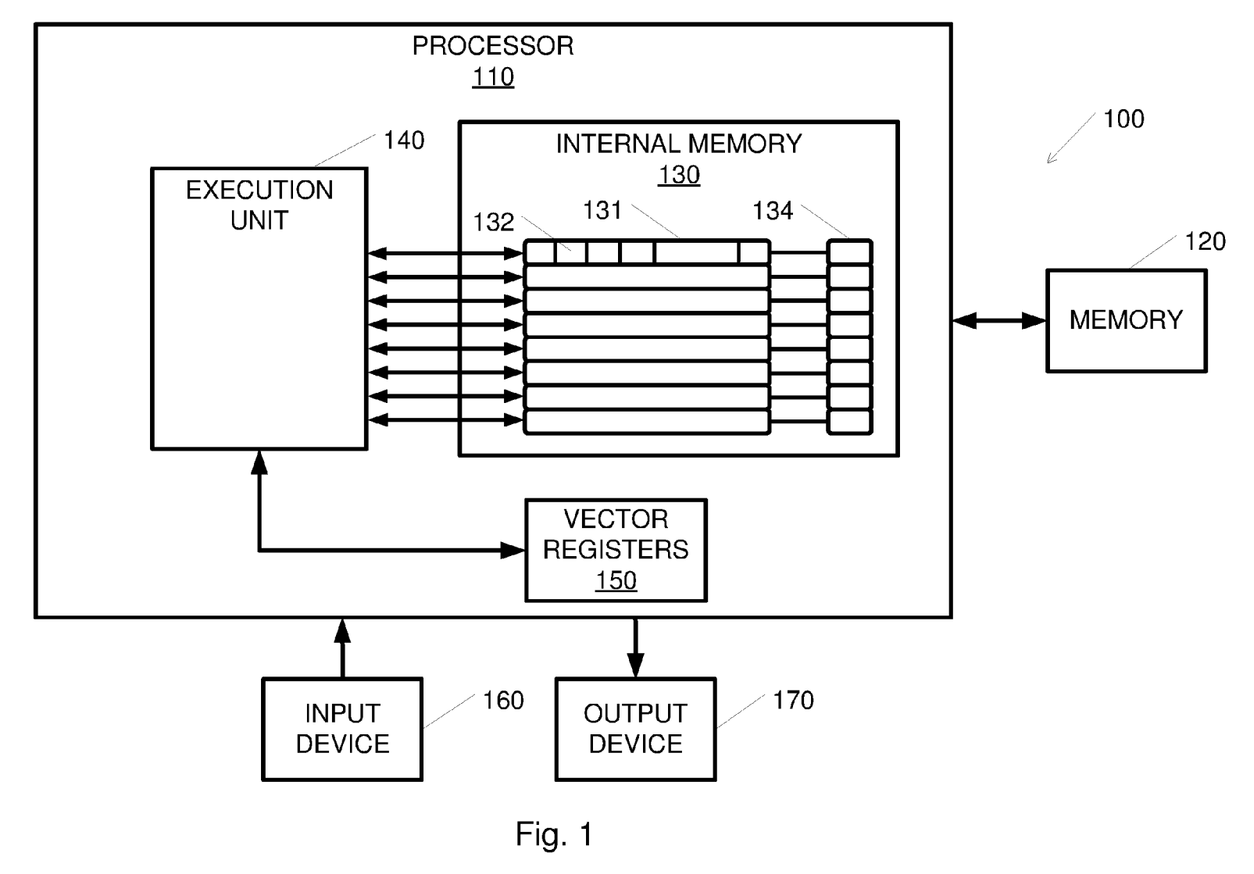
FIG. 1 is schematic illustration of an exemplary device according to embodiments of the invention.

Reference is made to FIG. 1, which is a schematic illustration of an exemplary device according to embodiments of the invention. A device 100 may include a computer device, video or image capture or playback device, cellular device, a cellular telephone, a personal digital assistant (PDA), a video game console or any other digital device. Device 100 may include any device capable of executing a series of instructions, for example to load and filter strings of data. Device 100 may include an input device 160 such as a mouse, a keyboard, a microphone, a camera, a Universal Serial Bus (USB) port, a compact-disk (CD) reader, any type of Bluetooth input device, etc., for providing input strings and other input, and an output device 170, for example, a transmitter or a monitor, projector, screen, printer, speakers, or display, for displaying multi-dimensional data such as video, image or audio data on a user interface according to a sequence of instructions executed by processor 110.

Device 100 may include a processor 110. Processor 110 may include or may be a vector processor, a central processing unit (CPU), a digital signal processor (DSP), a microprocessor, a controller, a chip, a microchip, a field-programmable gate array (FPGA), an application-specific integrated circuit (ASIC) or any other integrated circuit (IC), or any other suitable multi-purpose or specific processor or controller.

Device 100 may include an external memory unit 120 and an internal memory unit 130. Internal memory unit 130 may be a memory unit directly accessible to or internal to (physically attached or stored within) processor 110. Internal memory unit 130 may be a short-term memory unit, external memory unit 120 may be a long-term and/or short-term memory unit. Internal memory unit 130 and external memory unit 120 may include, for example, random access memory (RAM), dynamic RAM (DRAM), flash memory, cache memory, volatile memory, non-volatile memory or other suitable memory units or storage units. Internal memory unit 130 and external memory unit 120 may be implemented as separate (for example, "off-chip") or integrated (for example, "on-chip") memory units. For example, internal memory unit 130 may be or may include a tightly-coupled memory (TCM), a buffer, or a cache, such as, an L-1 cache or an L-2 cache. Other or additional memory architectures may be used.

According to some embodiments of the present invention, internal memory unit 130 may include a plurality of individually addressable memory banks 131. As used herein, the width of internal memory unit 130 may refer to the number of memory banks 131. Each memory bank 131 may include a plurality of memory elements 132, where each memory element 132 or plurality of memory elements 132 may be configured to store a single data element. In or during each read or write cycle a single data element may be read from or written into one or more memory element 132 of each memory bank 131. Thus, in each read or write cycle a single data element may be read from or written into memory elements 132 having different and uncorrelated addresses within each one of memory banks 131, as required by the application. Internal memory unit 130 may be arranged in rows and columns, where each memory bank 131 may represent a column of internal memory unit 130, and may have a dedicated and independent address generator 134. System 100 may include more than one internal memory units 130. The width of a memory element 132, e.g., the number of bits in each memory element 132 may be selected according to the type of data element stored in memory unit 130. Data elements may be of any required data type, e.g., bit, byte, word, double-word, 32-bit elements, 64-bit elements, floating point, complex numbers, etc. The depth of memory banks 131, e.g., the number of memory elements 132 in each of memory banks 131, may be selected according to the application.

Processor 110 may include an execution unit 140. Processor 110 may request, retrieve, and process data from external memory unit 120 and/or internal memory unit 130, and may control, in general, the pipeline flow of operations or instructions executed on the data. Processor 110 may receive an instruction, for example, from a program memory (for example, in external memory unit 120 or internal memory 130) to load and/or to filter a string of data elements. In one example, the instruction may filter or perform other operation on a string of data by multiplying the data elements by coefficients of a symmetrical filter. According to embodiments of the present invention, processor 110 may receive an instruction to load data elements from internal memory 130 as described herein.

Processor 110 may include a plurality of individually addressable memory units, referred to as vector registers 150, for storing data elements and coefficients. As used herein, a vector may refer to a one-dimensional (1D) array of data elements. Vector registers 150 may be internal to processor 110 and either internal/integrated with internal memory unit 130 or external/separate from internal memory unit 130. Processor 110 may load or transfer data elements to a memory relatively more internal or accessible to processor 110, for example, from external memory unit 120 to internal memory unit 130, or from internal memory unit 130 to vector registers 150. When using vector registers 150, processor 110 may load a part or a portion of a string of data elements stored in memory unit 130 into vector registers 150. Loading data elements stored in memory unit 130 into vector registers 150 may be performed during or in a read cycle, also referred to as load cycle. A length of a single load or read cycle may be measured in clock cycles (for example, clock cycles of processor 110) and may depend on access time of the memory unit. A more internal or accessible memory unit may refer to a memory unit with shorter access times and faster load or read cycles. Each of vector registers 150 may include a plurality of memory elements, each configured to store a single data element. Thus, according to some embodiments, a vector register may be a register configured to store a plurality of data elements or a vector of data elements. The memory elements may be configured to store data elements of any required type, e.g., bytes, words, 32-bit words, 64-bit words, integers, complex numbers or any other size or type of data element, as required by the application. In addition, some or all of vector registers 150 may function as right or left shift registers, capable of shifting the data elements stored in these registers to the right or to the left, respectively. As used herein shifting to the left may refer to moving each data element by one memory element to a higher address in the vector register, where the data element stored in the last address is shifted out, and shifting to the right may refer to moving each data element by one memory element to a lower address in the vector register, where the data element stored in the lowest address is shifted out.

According to some embodiments of the present invention, processor 110 may be configured to receive, for example, from a program memory (e.g., in external memory unit 120 or internal memory 130), an instruction to load data elements for a symmetrical filter operation according to embodiments of the present invention. The instruction may include a pointer to an input string in internal memory 130, a post increment value to update the pointer after executing the instruction, a stride length parameter, a stride type parameter to define a sign of the stride length parameter, e.g., increment or decrement, and vector registers to store the loaded data. Execution unit 140 may be configured to execute the instruction by receiving the pointer, the post increment value, the stride length, the stride type and two vector registers from the instruction, and loading a plurality of data elements from the plurality of memory banks 131 in parallel, for example, in a single read cycle, as disclosed herein. As used herein, the term pointer may be used to indicate the location of data in the memory. A pointer may include the address of the data, a name of a register storing the address of the data, or any other information indicative of the location of the data in the memory.

As known in the art, in case of a bilaterally symmetrical filter, input elements that are equally distant from the center of the filter may be first added and only than multiplied by a corresponding filter coefficient. Throughout this application input elements that are equally distant from the center of the filter may be referred to as symmetrical data elements. According to embodiments of the present invention, execution unit 140 may perform a plurality of symmetrical filtering operations in parallel, e.g., a filter operation for a single output result may be performed in serial, and a plurality of serial filters may be performed in parallel to each other. Thus, execution unit 140 may generate a plurality of output results in a plurality of computational cycles. In a typical computational cycle a stage of a plurality of parallel filters may be performed, e.g., for each output result, two symmetrical data elements that are equally distant from the center of the filter may be added and multiplied by the appropriate filter coefficient. In each computational cycle, other two symmetrical data elements may be added and multiplied by the appropriate filter coefficient. The results of the plurality of computational cycles may be accumulated, e.g., added together (separately for each output result) to arrive at the final output results after the last computational cycle of the filter operation for that output result. As used herein, an input string or a data string may refer to a plurality of data elements used for the plurality of filter operations that are performed in parallel (in some embodiments the input string may include some extra elements).

According to some embodiments of the present invention, processor 110 and/or execution unit 140 may be configured to read or load, in a single read cycle, into at least one of vector registers 150, a subset of right-side data elements and a subset of left-side data elements of an input string stored in memory unit 130, where the right-side data elements and the left-side data elements are equally distant from the center of the input string. According to some embodiments, the input string may be stored successively in memory unit 130. Thus, the subset of right-side data elements may include consecutive data elements and the subset of left-side data elements may include consecutive data elements, however, the right-side data elements and the left-side data elements may not be successive in memory unit 130. For example, the right-side data elements and the left-side data elements may be separated by a whole number of rows in memory unit 130. Processor 110 may be further configured to perform filtering of the input string using a symmetrical filter with the loaded right-side data elements and left-side data elements, for example, as disclosed herein. As noted before, memory unit 130 may include a plurality of individually addressable memory banks 131. Thus, according to some embodiments, each data element of the subset of right-side data elements and the subset of left-side data elements may be loaded from a different memory bank 131. According to some embodiments, the number of data elements in the subset of right-side data elements and in the subset of left-side data elements may equal a half of the width of memory unit 130. It should be readily understood that storing data elements successively in memory may refer to storing data elements one after the other in memory. Addresses of successive data elements may not necessarily be consecutive, for example, when a single data element is stored in a plurality of memory elements (for example as in FIG. 4).

Figure 2:
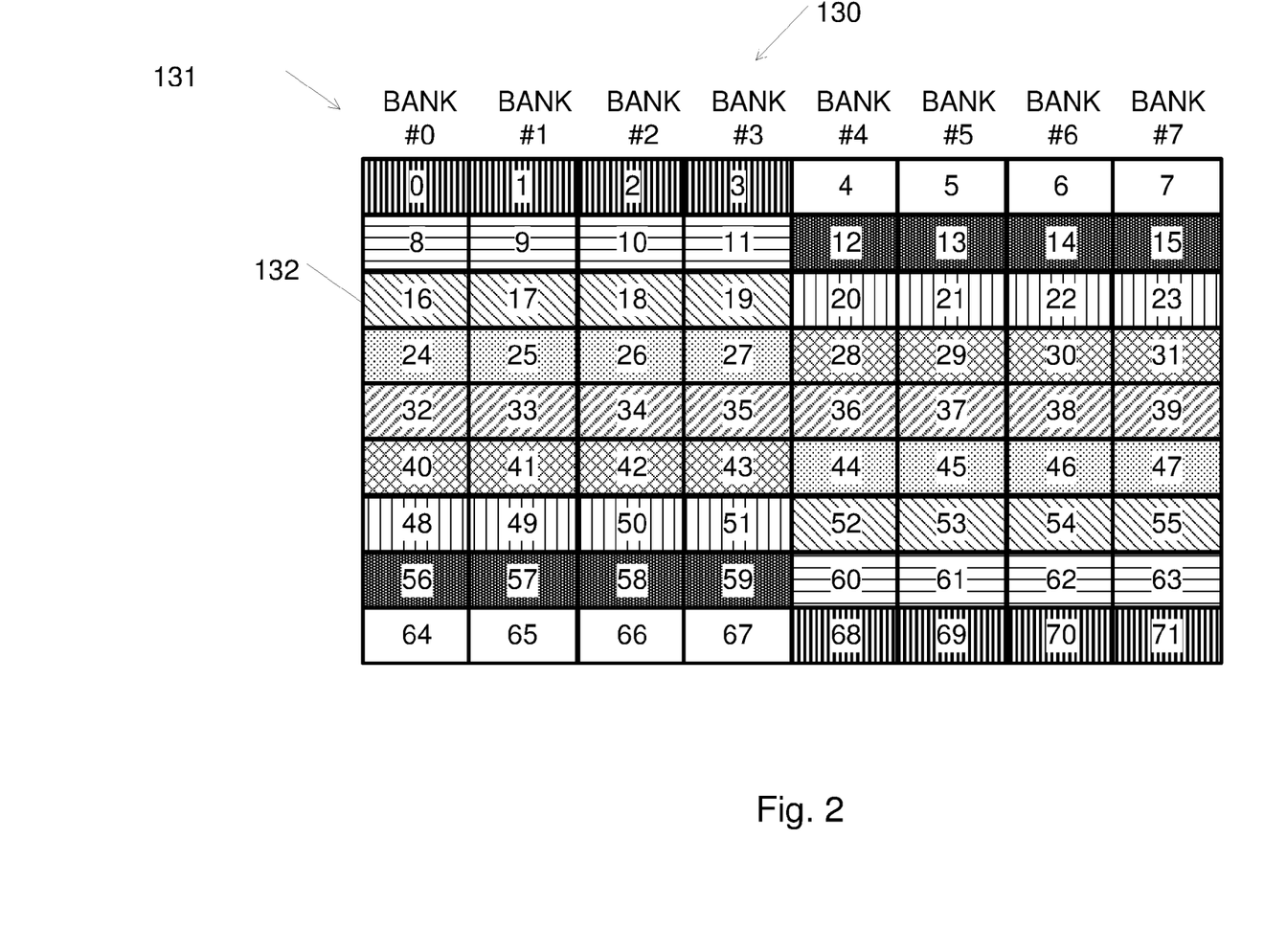
FIG. 2 depicts an exemplary memory unit storing an input string helpful in demonstrating embodiments of the present invention.

Reference is now made to FIG. 2 which depicts an exemplary memory unit storing an input string, helpful in demonstrating embodiments of the present invention. In some embodiments, the input string depicted in FIG. 2 may be used for calculating eight output results, e.g., y[64]-y[71], of a symmetric filter with an odd or even number of taps. Other numbers of results may be calculated.

In the example of FIG. 2, internal memory unit 130 includes eight memory banks 131, where each column in FIG. 2 represents a single memory bank 131. Other numbers of banks may be used. Each one of memory banks 131 may be individually addressable, such that in each read cycle, any one of the single data elements stored in a memory bank may be loaded from the memory bank, for example, into one or more internal registers 150. Thus, in a single read cycle a total of eight data elements may be loaded form internal memory unit 130, a single data element from each one of memory banks 131. The non-limiting example of FIG. 2 presents an input string of 72 data elements that are stored in nine rows of internal memory unit 130. In this example, the data elements are aligned with internal memory unit 130, e.g., the first data element of the input string is stored in the first memory bank 131, the second data element of the input string is stored in the second memory bank 131, and so on in a sequential manner.

The input string presented in FIG. 2 may be used for calculating a plurality of output results in parallel. A first half of the input string may be considered as left-side data elements of the input string, and a second half of the input string may be considered as right-side data elements. Since the example input string includes 72 data elements, data elements 0-35 may be considered left-side data elements and data elements 36-71 may be considered right-side data elements. According to embodiments of the present invention, in each read or load cycle a right-side subset including right-side data elements and a left-side subset including left-side data elements may be loaded. In some embodiments the right-side data elements and the left-side data elements may be equally distant from the center of the input string. The center of the input string may refer to a middle point in which half of the data elements are before the center and half of the data elements are after the center. In the example presented in FIG. 2, the center of the input string is between data elements 35 and 36. In some embodiments the distance of data elements from the center of the input string may be measured in data elements. For example, data elements that are immediately next to the center of the input string (e.g., data elements 35 and 36) are both zero data elements distant from the center of the input string; the distance of data elements 34 and 37 from the center of the input string is one data element, and so on. In some embodiments, the left-side subset may include sequential data elements and the right-side subset may include sequential data elements. For example, subsets of data elements that are equally distant from the center of the input string, e.g., data elements 28-31 and data elements 40-43, and so on, may be loaded in a single read or load cycle. In some embodiments the loading may be repeated for different subsets of the input string. Thus, in each read cycle, different subsets of the input string may be loaded. It should be readily understood that while the centermost right-side data elements and the left-side data elements of the input string may be located in successive locations in the memory, data elements of other left-side subsets and right-side subsets may include data elements that are not located in successive locations in the memory. As noted before, memory unit 130 may include a plurality of individually addressable memory banks 131. Thus, according to some embodiments, each data element of the subset of right-side data elements and the subset of left-side data elements may be loaded from a different memory bank. It should be noted that as used herein, the division to left-side data elements and right-side data elements refers to the input string, e.g., to the string required for performing the plurality of parallel filtering operations. In some embodiments a symmetrical filter may be performed on the input string using the loaded right-side data elements and left-side data elements, for example as disclosed herein.

In the example of FIG. 2, data elements that are loaded in a single read cycle are marked with similar background. Table 1 presents an exemplary sequence of nine read or load cycles for reading or loading data elements 0-71 according to embodiments of the present invention.

TABLE 1 an exemplary sequence of nine read cycles
for reading data elements 0-71

| Read cycle # | Data element read from memory bank # | | | | | | | |
|---|---|---|---|---|---|---|---|---|
| | 0 | 1 | 2 | 3 | 4 | 5 | 6 | 7 |
| 1 | 32 | 33 | 34 | 35 | 36 | 37 | 38 | 39 |
| 2 | 40 | 41 | 42 | 43 | 28 | 29 | 30 | 31 |
| 3 | 24 | 25 | 26 | 27 | 44 | 45 | 46 | 47 |
| 4 | 48 | 49 | 50 | 51 | 20 | 21 | 22 | 23 |
| 5 | 16 | 17 | 18 | 19 | 52 | 53 | 54 | 55 |
| 6 | 56 | 57 | 58 | 59 | 12 | 13 | 14 | 15 |
| 7 | 8 | 9 | 10 | 11 | 60 | 61 | 62 | 63 |
| 8 | 64 | 65 | 66 | 67 | 4 | 5 | 6 | 7 |
| 9 | 0 | 1 | 2 | 3 | 68 | 69 | 70 | 71 |

In the example presented in FIG. 2 the input string is stored successively in memory unit 130. Thus, the subset of right-side data elements may include consecutive data elements and the subset of left-side data elements may include consecutive data elements. However, the subsets of right-side data elements and the left-side data elements may not be successive in memory unit 130, for example, as can be seen in read cycles no. 2-9. In read cycles no. 2-9, the right-side data elements and the left-side data elements are separated by a whole number of rows in memory unit 130. In read cycle no. 1 of this example, the loaded data elements include the center of the data string which is located in successive locations in the memory. Processor 110 may be configured to perform filtering of the input string using a symmetrical filter with the loaded right-side data elements and left-side data elements, for example, as disclosed herein.

As can be seen in the non-limiting example of FIG. 2, in the first read cycle the centermost elements of the input string are loaded, and in each subsequent read cycle, corresponding data elements that are further distant from the center are being loaded. In nine read cycles, the entire input string is loaded. As noted before, the input string presented in FIG. 2 may be used to generate a plurality, e.g., eight, output results. It should be noted that the order of read cycles presented in table 2 is non-limiting. For example, the order may be reversed. In some embodiments the order of the first and second read cycles may be reversed. Typically, after completing the filtering operation of the input string a next input string including data elements required for calculating the next output results may be loaded, e.g., a next input string may include data elements 8-79, and so on.

Below is a non-limiting example for a dedicated instruction for loading data elements of an input string, for example the input string of FIG. 2:

$$LD\{stride\_reg++\}(r0)-4,v8[4],v11[0] \qquad \text{(instruction 1)}$$

The instruction uses the following parameters and switches:
r0→pointer to the left-side subset. This pointer may be initialized before the first load instruction to point to the left-side data elements of the first load. Specifically, r0 may be initialized to point to the leftmost data element of the left-side subset of the first load. r0 may be modified, e.g., incremented or decremented, after every execution of the load instruction as indicated by the post_increment_value switch, in this case −4 (minus four). The post_increment_value may equal half the row width of internal memory 130, or the number of elements of the left-side subset or right-side subset. The sign of the post_increment_value switch may indicate whether r0 should be incremented or decremented. For example, for row width of eight memory banks, each subset may include four data elements and the post_increment_value may equal +4 (plus four) or −4 (minus four). Thus, r0 may be post incremented or decremented by four elements every execution of the load instruction.
v8→vector register for storing the left-side subset. In this example v8 may store the left-side subset at v8[4], v8[5], v8[6] and v8[7].
v11→vector register for storing the right-side subset. In this example v11 may store the right-side subset at v11[0], v11[1], v11[2] and v11[3]. v8 and v11 may be two of vector registers 150 depicted in FIG. 1.
The command may use a hidden stride register, stride_reg, for storing the stride length parameter. The stride length parameter may indicate the number of rows separating the left-side subset and the right-side subset. The stride register may be initialized in advance with the value of 0. The stride register may be modified, e.g., incremented or decremented every execution of the load instruction according to the sign of the switch that immediately follows it. For example, '++' may indicated incrementing the stride register by one (a single row) and a sign of '−−' may indicate decrementing the stride register by one (a single row). In this instruction the stride is being incremented by one in or after every execution.
While the address of the left-side subset may be given by r0, the address of the right-side subset may be calculated based on the row width and the stride length. For example, in case of consecutive addressing, the address of the right-side subset may be calculated by r0+row_width/2*element_size+stride_reg*row_width*element_size, where row_width is the number of data elements in a row of internal memory unit 130, element_size is the number of addresses occupied by each data element and stride_reg is the stride length.

When using instruction 1 for the example of FIG. 2, r0 may be initialized to 32, stride_reg may be initialized to 0, and row_width to 8, before the first load. When executing instruction 1, r0 may be decremented by 4 elements, v8[4 . . . 7] may be loaded from address r0, and v11[0 . . . 3] may be loaded from address r0+row_width/2*element_size+stride_reg*row_width*element_size. Loading the input string starts from the center of the string and moves outwards.

Using instruction 2 given below, loading may start from the edges of the string and move to the center:

LD{stride_reg--}(r0)+4,v8[4],v11[0]  (instruction 2)

When using instruction 2 for the example of FIG. 2, r0 may be initialized to 0, stride_reg may be initialized to 8, and row_width to 8, before the first load. When executing instruction 2, r0 may be incremented by 4 elements, v8[4 . . . 7] may be loaded from address r0 and v11[0 . . . 3] may be loaded from address r0+row_width/2*element_size+stride_reg*row_width*element_size. Loading the input string starts from the edges of the string and moves inwards to the center.

It should be readily understood that the instructions presented herein are non-limiting examples of possible implementations of embodiments of the present invention. Embodiments of the present invention are not limited to these instructions and may be implemented using other instructions, with other formats, parameters and switches. Also, it is not mandatory that load operations would start at the center and move outwards, or start at the edges and move inwards. The loads may be performed in any desirable order, as required by the application.

Figure 3:
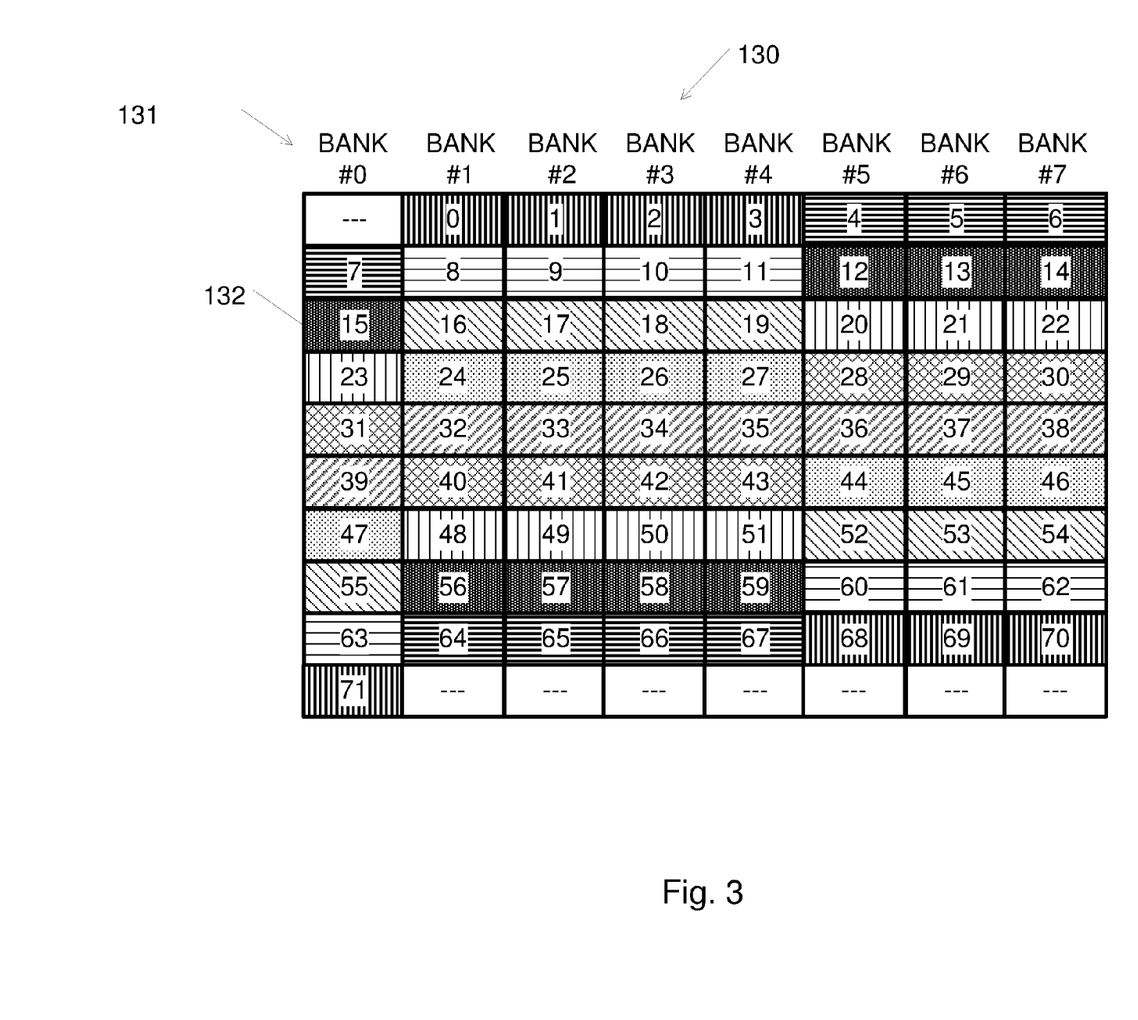
FIG. 3 depicts an exemplary memory unit storing an unaligned input string helpful in demonstrating embodiments of the present invention.

According to embodiments of the present invention, data elements of the string do not have to be aligned with the memory banks. Reference is now made to FIG. 3 which depicts an exemplary memory unit storing elements of an unaligned input string, helpful in demonstrating embodiments of the present invention. Here again, data elements that are loaded in a single read cycle are marked with similar background. Table 2 presents an exemplary sequence of nine read cycles for reading data elements 0-71 according to embodiments of the present invention. The principals of loading data elements as disclosed herein, for example with relation to FIG. 2 and table 1 apply here as well.

TABLE 2 an exemplary sequence of nine read cycles for reading data elements 0-71 of a nonaligned input string

| Read cycle # | Data element read from memory bank # | | | | | | | |
|---|---|---|---|---|---|---|---|---|
| | 0 | 1 | 2 | 3 | 4 | 5 | 6 | 7 |
| 1 | 39 | 32 | 33 | 34 | 35 | 36 | 37 | 38 |
| 2 | 31 | 40 | 41 | 42 | 43 | 28 | 29 | 30 |
| 3 | 47 | 24 | 25 | 26 | 27 | 44 | 45 | 46 |
| 4 | 23 | 48 | 49 | 50 | 51 | 20 | 21 | 22 |
| 5 | 55 | 16 | 17 | 18 | 19 | 52 | 53 | 54 |
| 6 | 15 | 56 | 57 | 58 | 59 | 12 | 13 | 14 |
| 7 | 63 | 8 | 9 | 10 | 11 | 60 | 61 | 62 |
| 8 | 7 | 64 | 65 | 66 | 67 | 4 | 5 | 6 |
| 9 | 71 | 0 | 1 | 2 | 3 | 68 | 69 | 70 |

As noted before, the examples of FIGS. 2-3 are non-limiting. Embodiments of the present invention may be utilized for practically any length of filter, including filters with even or odd number of coefficients, and for any number of memory banks. Additionally, it is not mandatory to load a data element from each memory bank in each cycle, e.g., in some or all of the read cycles, data elements may be loaded from only some of the memory banks. In addition, the sequence of the read cycles may vary according to the application.

Figure 4:
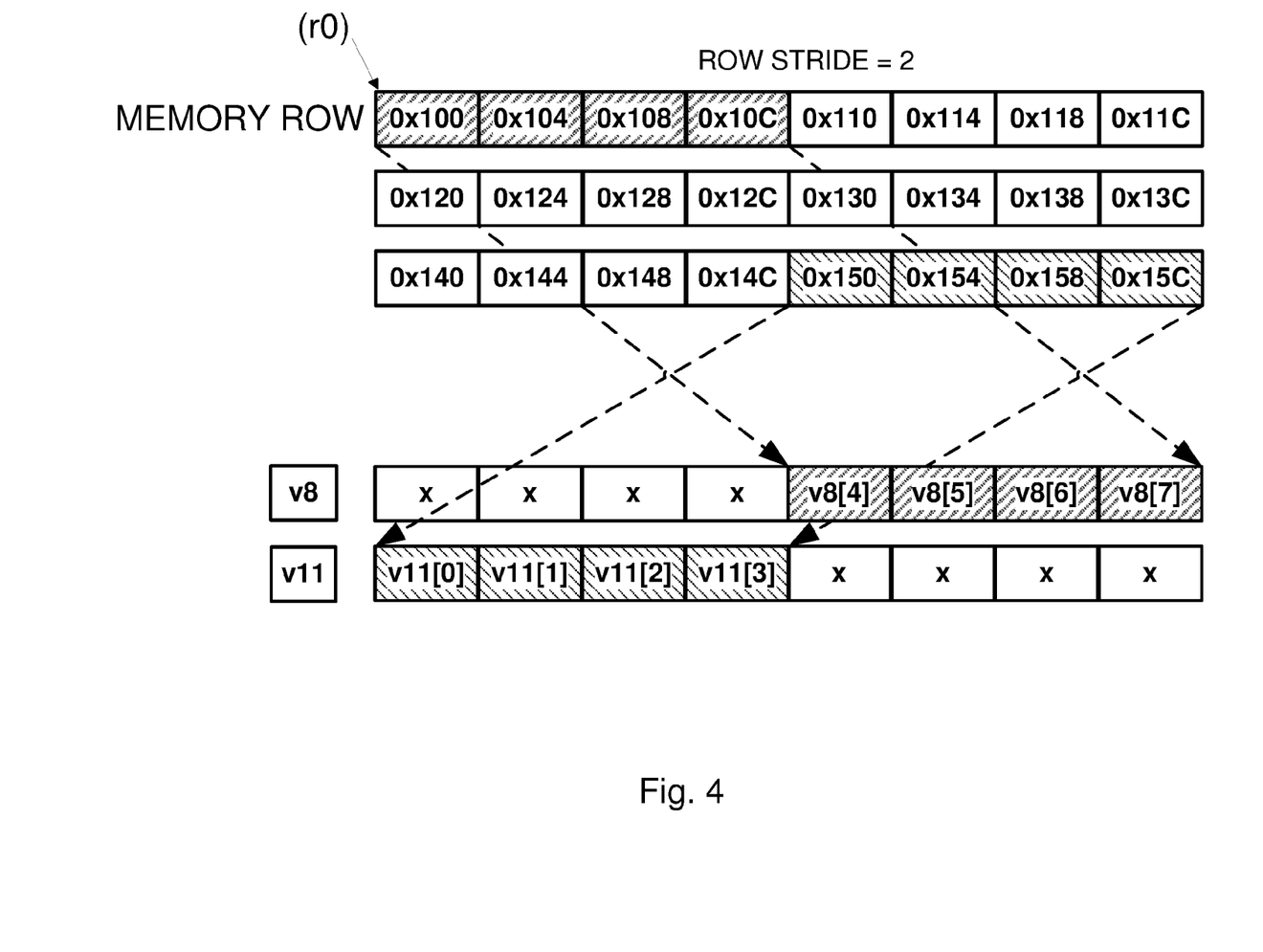
FIG. 4 depicts an example of loading a left-side and right-side subsets with a row stride value of two, according to embodiments of the present invention.

Reference is now made to FIG. 4, which depicts an example of loading a left-side and right-side subsets with a row stride value of two, according to embodiments of the present invention. The hexadecimal values represent addresses of data elements, where each data element occupies four memory elements (element_size=4). In this example, r0 points to address 0x100 and the stride_reg is 2. Thus, when executing the load instruction, a left-side subset of four data elements stored in the address r0 points to (e.g., at addresses 0x100 to 0x10C) may be loaded to elements 4-7 of internal register v8. The address of the right-side subset is calculated by:

r0+row_width/2*element_size+
   stride_reg*row_width*element_size=0x100+8/
   2*4+2*8*4=0x150.

Thus, a right-side subset of four data elements stored at addresses 0x150 to 0x15C may be loaded to elements 0-3 of internal register v11. It should be readily understood that this example is non-limiting. For example, the right-side and left-side subsets may be loaded into a single vector register.

Figure 5:
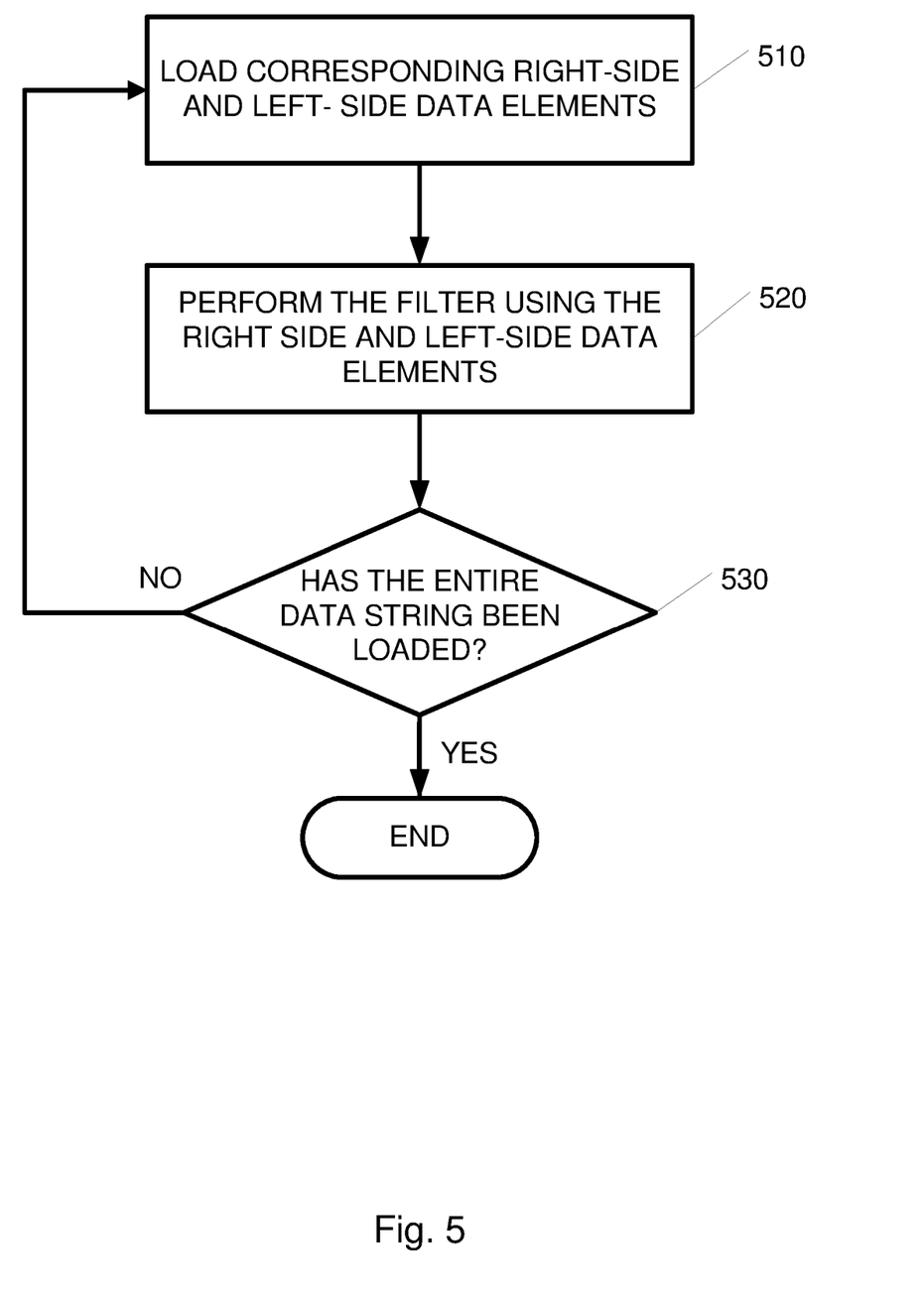
FIG. 5 is a flowchart diagram illustrating a method for loading an input string according to embodiments of the present invention.

Reference is now made to FIG. 5, which is a flowchart diagram illustrating a method for loading an input string, according to embodiments of the present invention. According to some embodiments, a method for loading data elements of an input string may be performed by any suitable processor, for example, processor 110 depicted in FIG. 1. In some embodiments a method for loading data elements of an input string may be initiated by a dedicated command or instruction.

In operation 510, a subset of right-side data elements and a subset of left-side data elements of the input string stored sequentially in the memory may be loaded, where each of the right-side data elements has a corresponding left-side data element. In operation 520 the loaded data elements may be used by the filter as disclosed herein. In operation 530 it is checked whether the entire input string has been loaded. If the entire input string has been loaded, an embodiment of the method ends or moves to a next input string. If there are data elements of the input string that have not been loaded, an embodiment of the method returns to operation 510 to load more data elements of the string.

Figure 6:
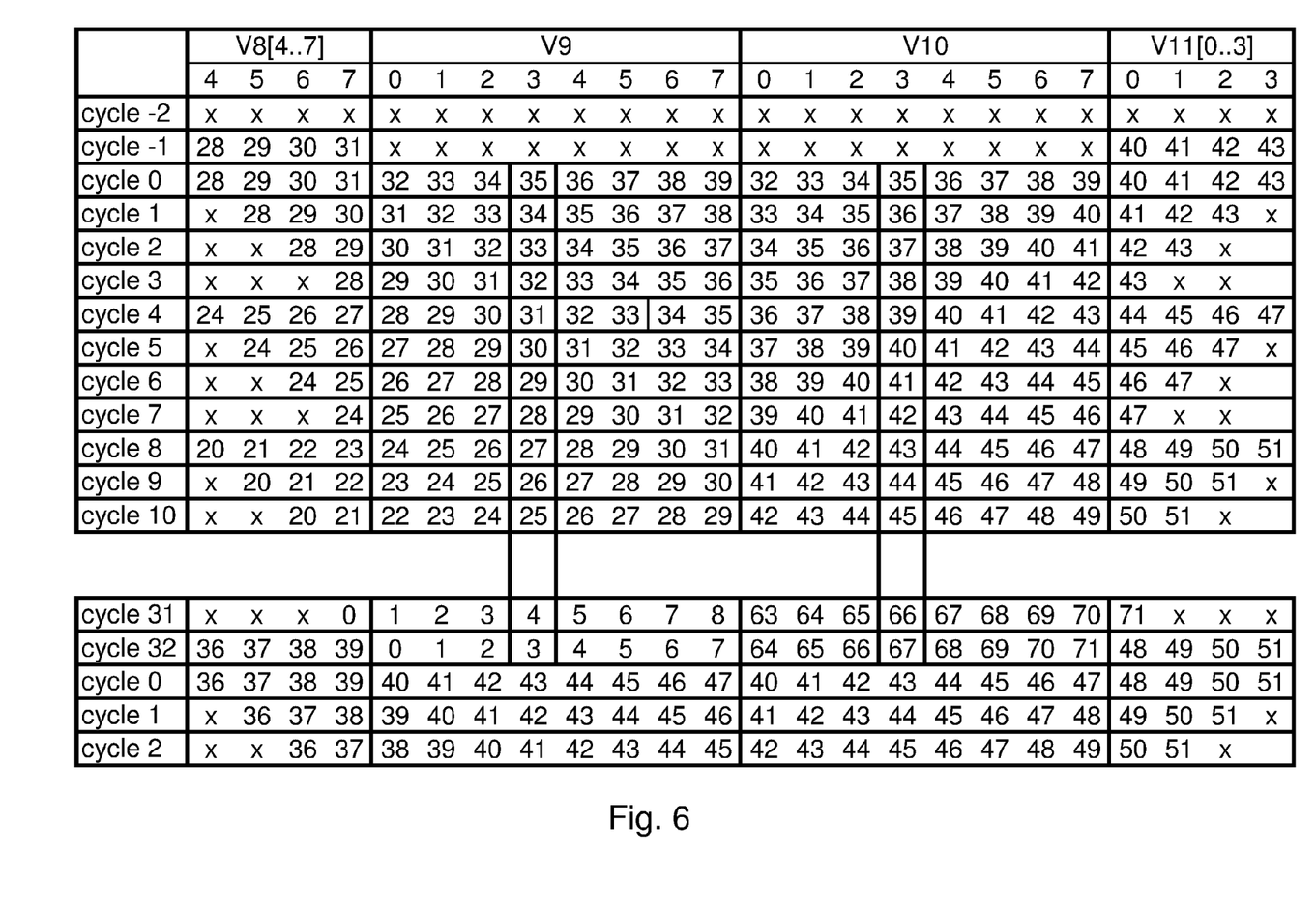
FIG. 6 depicts data elements stored in a plurality of internal registers for performing a symmetrical filter with odd number of coefficients, according to embodiments of the present invention.

Reference is now made to FIG. 6 which depicts data elements stored in a plurality of internal registers in a plurality of computational cycles, for performing a symmetrical filter with odd number of coefficients, according to embodiments of the present invention. Four internal registers are used in the present embodiment: left reservoir register, v8, right reservoir register, v11, left data register v9, and right data register, v10. Cycle −1 represents a preparation cycle. FIG. 6 presents a plurality of cycles of a single execution of an odd symmetrical filter for the input string presented in FIG. 2 or FIG. 3. In the calculation presented in FIG. 6, output samples y[64]-y[71] are calculated, and the center of the input string includes data elements 32-39. In preparation cycle #−1, a left-side subset including data elements immediately preceding the center of the input string, e.g., data elements 28-31, and a right-side subset including data elements immediately following the center of the input string, e.g., data elements 40-43 may be loaded into one or more internal registers. For example, the left-side subset may be loaded into left reservoir register, v8, and the right-side subset is loaded into right reservoir register, v11. In cycle #0, the center of the input string, e.g., a left-side subset including data elements 32-35 a right-side subset including data elements 36-39 may be loaded into one or more internal registers. For example, the left-side subset and the right-side subset may be loaded into both data registers v9 and v10. Thus, after cycle #0, both the right and the left data registers store the center of the input string. In each subsequent cycle data elements in left data register, v9, and in left reservoir register, v8 may be shifted by one element to the right, and data elements in right data register v10 and in right reservoir register, v11 may be shifted by one element to the left, where the left reservoir register, v8 feeds (e.g., provides input to) left data register, v9, and right reservoir register, v11 feeds right data register, v10. Thus, when data elements are shifted, the rightmost data element of left reservoir register, v8, e.g., the data element stored in v8[7] is shifted to the leftmost element in left data register v9, e.g., to v9[0], and the leftmost data element sored in right reservoir register, v11, e.g., the data element stored in v11[0] is shifted to the rightmost element in right data register v10, e.g., to v10[7]. At this stage and onward, corresponding address of left data register v9 and right data register v10 store corresponding or symmetrical data elements of the plurality of filter operations that may be performed in parallel. Thus, adding symmetrical data elements may be performed by adding corresponding address or elements of left data register v9 and right data register v10. Filtering is performed in parallel for output samples y[64]-y[71] by, in each cycle, e.g., in each clock cycle, adding symmetrical data elements of the right data register and the left data register, multiplying the sum by the appropriate filter coefficient and accumulating the results according to:

$$acc\mathrel{<}=(V9+V10)*coefficient+acc$$

Where acc is the accumulator for the filter results. As can be seen in the example, in every fourth cycle (e.g, cycle #4, #8, etc.) the last data elements of the reservoir registers is feed into the data registers and new left-side and right-side subsets are loaded into the reservoir registers. For example, in cycle four data elements 24-27 are loaded to left reservoir register v8 and data elements 44-47 are loaded to right reservoir register v11. In all the loading cycles except for cycle #0, the data elements loaded to right and left reservoir registers are non-consecutive and are not stored in a single row of the memory from which they are loaded. Therefore, according to prior art, loading these data elements would require at least two load cycles, in which the core would halt and wait for data. According to embodiments of the present invention presented herein, loading the left-side and right-side subsets may be performed in a single load cycle, without halting the core, even when the data elements loaded to the right and left reservoir registers are non-consecutive.

In cycle 32 the filtering process for output samples y[64]-y[71] may be completed. Thus, the next cycle may be considered cycle #0 for data elements in a next input string. Thus the data elements 40-47 may now be the new center of the input string. Cycle 32, which is the last cycle for the calculation of output samples y[64]-y[71], may be used as a preparation cycle (equivalent to cycle #-1) for the filtering of the next input string. Thus, in the same cycle, a left-side subset including data elements immediately preceding the new center of the next input string, e.g., data elements 36-39, and a right-side subset including data elements immediately following the center of the next input string, e.g., data elements 48-51 may be loaded into left reservoir register, v8 and right reservoir register, v11, respectively. In the next cycle, which is again considered cycle #0, the new center of the string, e.g., data elements 40-47 may be loaded to data registers v9 and v10, and the process may be repeated for calculating output samples y[72]-y[79], and so on.

Figure 7:
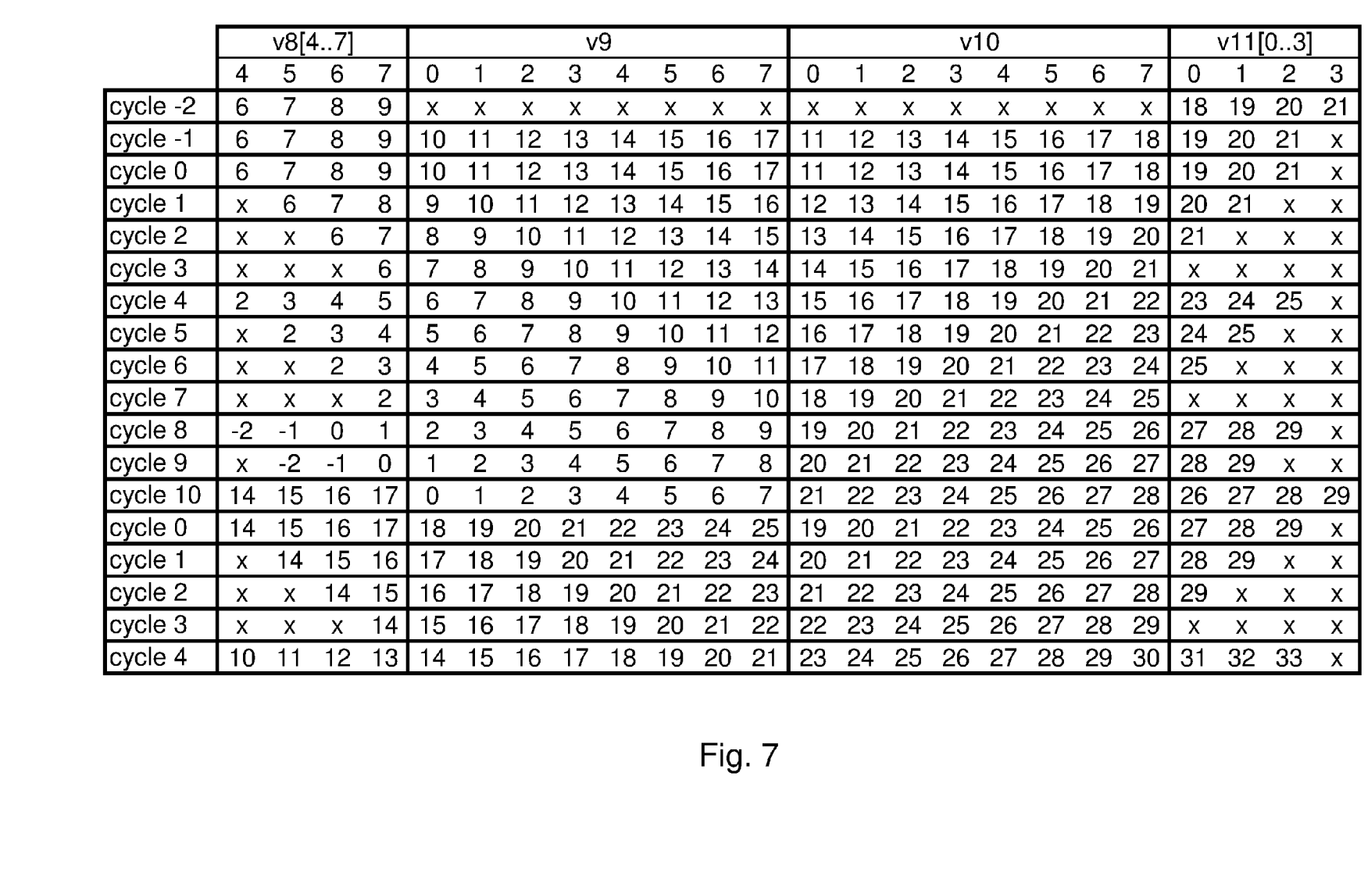
FIG. 7 depicts data elements stored in a plurality of internal registers for performing a symmetrical filter with even number of coefficients, according to embodiments of the present invention.

Reference is now made to FIG. 7 which depicts data elements stored in a plurality of internal registers in a plurality of computational cycles, for performing a symmetrical filter with even number of coefficients, according to embodiments of the present invention. FIG. 7 presents a plurality of cycles of a single calculation of a symmetrical filter, in which output samples y[21]-y[28] are calculated, the input string includes data elements 0-28 which are therefore at the center of the input string, and the filter includes 22 taps. The principals of operation of a filter with even number of coefficients are similar to those of the filter with odd number of coefficients described above, except that in the preparation cycles, and in every load cycle, data elements in right data register v10 are shifted to the left with respect to left reservoir register, v8, and a single data element of the right reservoir register v11 is feed into right data register v10. In the example of FIG. 7, in preparation cycle #-1 data element 18 that was loaded to right reservoir register v11[0] is feed into right data register v10[7]. In cycle #4 and in every subsequent load cycle data is loaded to left reservoir register, v 8, and the data loaded into right reservoir register is loaded and shifted in the same cycle. For example in cycle #4 right-side subset including data elements 22-25 is loaded to right reservoir register v11 and data element 22 is shifted in the same cycle to element 7 of right data register v10. Thus, again, from cycle #0 and onward, corresponding elements (e.g., elements with the same addresses) of left data register v9 and right data register v10 store symmetrical data elements of the input string. Thus, adding symmetrical data elements may be performed by adding corresponding elements of left data register v9 and right data register v10, and filtering may be performed similarly to the case of filters with odd number of coefficients.

Figure 8:
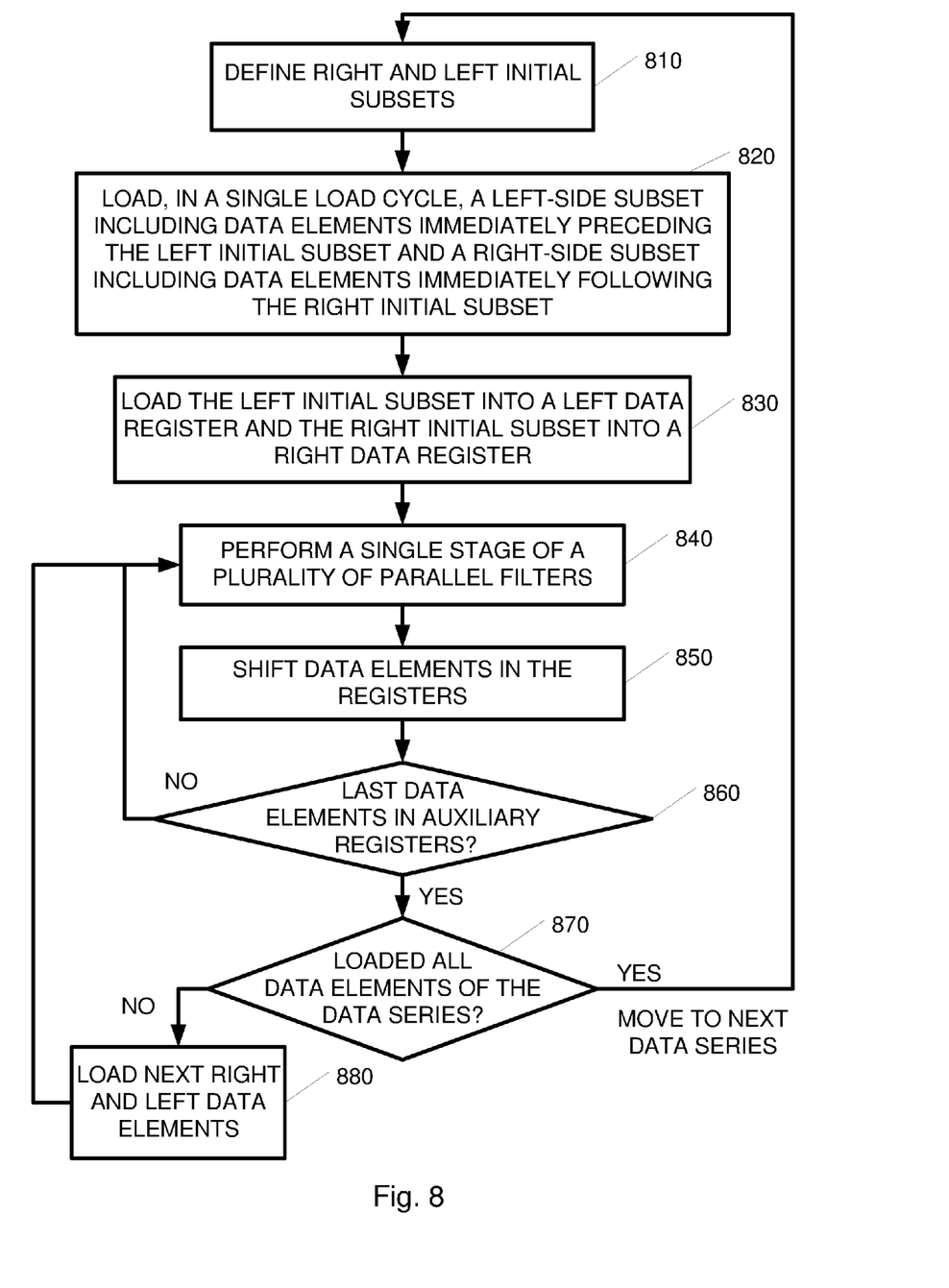
FIG. 8 is a flowchart diagram illustrating a method for performing a symmetrical filter, according to embodiments of the present invention.

Reference is now made to FIG. 8, which is a flowchart diagram illustrating a method for performing a symmetrical filter, according to embodiments of the present invention. According to some embodiments, a method for performing a symmetrical filter may be performed by any suitable processor, for example, processor 110 depicted in FIG. 1. In some embodiments a method for performing a symmetrical filter may be initiated by a dedicated command or instruction, or by a plurality of commands or instructions.

In operation 810 a left initial subset including data elements of an input string and a right initial subset including data elements symmetrical to the data elements of the left initial subset may be defined. In some embodiments, e.g., when performing a symmetrical filter with odd number of coefficients, both the left initial subset and right initial subset may include the center of the input string (for example as shown in FIG. 6). In some embodiments, e.g., when performing a symmetrical filter with even number of coefficients, the left initial subset may include the center of the input string, and the right initial subset may include the center of the input string shifted by one data element to the left (for example as shown in FIG. 7). In some embodiments, e.g., when performing the filter from outside in, the left initial subset may include an end of the input string, e.g., the last data elements of the input string, and the right initial subset may include a start of the input string, e.g., the initial data elements of the input string.

In operation 820, a left-side subset including data elements immediately preceding the left initial subset may be loaded into a left reservoir register, and a right-side subset including data elements immediately following the right initial subset, may be loaded into a right reservoir register. According to embodiments of the present invention, loading of the left-side subset and right-side subset is performed in a single load operation, e.g., in a single load cycle.

In operation 830, the left initial subset may be loaded into a left data register and the right initial subset may be loaded into a right data register, wherein symmetrical data elements are loaded into corresponding elements of the left data register and right data register. In case both the left initial subset and right initial subset include the center of the input string, the center of the input string may be loaded in a single load cycle and placed into both registers. In case the left initial subset includes the center of the input string, and the right initial subset includes the center of the input string shifted by one data element to the left, the center of the input string may be loaded in a single load cycle and placed into the left data register. The loaded data elements may be shifted by one element to the left and placed in the right data register. In the later case, the last data element in the right data register (e.g., data element 7 in V10 shown in FIG. 7), may be feed by the right reservoir register. In case the left initial subset includes the last data elements of the input string, and the right initial subset includes the initial data elements of the input string, loading data elements into the left data register and the right data register may require two load cycles, one for the data elements of the left data register and one for the data elements of the right data register.

Operations 840-880 may be repeated in every subsequent clock cycle or computational cycle, until all required data elements are loaded and processed. In operation 840 symmetrical data elements of the right data register and the left data register may be added, the sum may be multiplied by an appropriate filter coefficient and the results may be accumulated, e.g., added together. Thus in operation 840 a single stage of a plurality of parallel filters may be performed. In operation 850, data elements in the registers may be shifted. In some embodiments, data elements in the left data register and in the left reservoir register may be shifted by one element to the right, wherein the left reservoir register feeds the left data register, and data elements in right data register and in the right reservoir register may be shifted by one element to the left, wherein the right reservoir register feeds the right data register. In operation 860, if a last data element in the left reservoir register and/or in the right reservoir register is feed into the left data register and the right data register, an embodiment of the method moves to operation 870. Otherwise, an embodiment of the method moves back to operation 840. Thus, operations 840 and 850 are repeated until a last data element in the left reservoir register is feed into the left data register and/or until a last data element in the right reservoir register is feed into the right data register. In operation 870, if all data elements of the input string have been loaded, an embodiment of the method moves to the next input string and returns to operation 810. If not all elements of the input string have been loaded an embodiment of the method moves to operation 880. In operation 880 next right-side data elements may be loaded into the right reservoir register and, in the same load cycle, next left-side data elements may be loaded into the left reservoir register. An embodiment of the method than returns to operation 840, and so forth.

While being especially beneficial for image processing and communication systems, embodiments of the invention can be efficiently used in any application that requires symmetrical filtering; other uses or functionality may also be made in other embodiments.

Embodiments of the invention may be implemented for example on an integrated circuit (IC), for example, by constructing execution unit 140, as well as other components of FIG. 1 in an integrated chip or as a part of an chip, such as an ASIC, an FPGA, a CPU, a DSP, a microprocessor, a controller, a chip, a microchip, etc.

According to embodiments of the present invention, some units e.g., execution unit 140, as well as the other components of FIG. 1, may be implemented in a hardware description language (HDL) design, written in Very High Speed Integrated Circuit (VHSIC) hardware description language (VHDL), Verilog HDL, or any other hardware description language. The HDL design may be synthesized using any synthesis engine such as SYNOPSYS® Design Compiler 2000.05 (DC00), BUILDGATES® synthesis tool available from, inter alia, Cadence Design Systems, Inc. An ASIC or other integrated circuit may be fabricated using the HDL design. The HDL design may be synthesized into a logic level representation, and then reduced to a physical device using compilation, layout and fabrication techniques, as known in the art.

Embodiments of the present invention may include a computer program application stored in non-volatile memory, non-transitory storage medium, or computer-readable storage medium (e.g., hard drive, flash memory, CD ROM, magnetic media, etc.), storing instructions that when executed by a processor (e.g., processor 110) carry out embodiments of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method for symmetrical filtering of an input string, the method comprising:
   loading, into at least one vector register, in a single read cycle, a subset of right-side data elements and a subset of left-side data elements of the input string, wherein the input string is stored sequentially in a memory unit, wherein the right-side data elements and the left-side data elements are equally distant from the center of the input string; and
   performing filtering of the input string using a symmetrical filter with the loaded right-side data elements and left-side data elements,
   wherein the memory unit comprises a plurality of individually addressable memory banks, wherein each data element of the subset of right-side data elements and the subset of left-side data elements is loaded from a different memory bank.

2. The method of claim 1, wherein the memory is a tightly-coupled memory (TCM).

3. The method of claim 1, wherein the subset of right-side data elements includes consecutive data elements and the subset of left-side data elements includes consecutive data elements.

4. The method of claim 3, wherein the subset of right-side data elements and the subset of left-side data elements are separated by a whole number of rows in the memory.

5. The method of claim 4, further comprising:
   calculating an address of the right-side data elements based on an address of the left side data element, a width of the memory, the size of a memory element, and a stride length parameter, wherein the stride length parameter is indicative of the number of memory rows separating the subset of left-side data elements and the subset of right-side data elements.

6. A method for performing a symmetrical filter of a data string, the method comprising:
   defining a left initial subset including data elements of an input string stored sequentially in a memory unit, and a right initial subset including data elements corresponding to the data elements of the left initial subset;

loading, in a single read cycle, a left-side subset including data elements immediately preceding the left initial subset into a left reservoir register, and a right-side subset including data elements immediately following the right initial subset, into a right reservoir register;

loading the left initial subset into a left data register and the right initial subset into a right data register, wherein symmetrical data elements are loaded into corresponding elements of the left data register and right data register;

in every clock cycle subsequent to the loading of the left initial subset into the left data register and the right initial subset into the right data register:

adding symmetrical data elements of the right data register and the left data register, multiplying the sum by an appropriate filter coefficient and accumulating the results;

shifting data elements in left data register and in left reservoir register by one element to the right, wherein the left reservoir register feeds the left data register; and shifting data elements in right data register and in the right reservoir register by one element to the left, wherein the right reservoir register feeds the right data register;

if a last data elements in the left reservoir register and in the right reservoir register are feed into the left data register and the right data register, loading, in a single read cycle, next right-side data elements into the right reservoir register and next left-side data elements into the left reservoir register, wherein the left data register, the right data register, the left reservoir register and the right reservoir register are vector registers.

7. The method of claim 6, wherein the memory is a tightly-coupled memory (TCM).

8. The method of claim 6, wherein the memory comprises a plurality of individually addressable memory banks, wherein each data element of the subset of right-side data elements and the subset of left-side data elements is loaded from a different memory bank.

9. The method of claim 6, wherein the left initial subset comprises a center of the input string.

10. The method of claim 6, wherein the right initial subset comprises a start of the input string.

11. The method of claim 6, wherein the symmetrical filter comprises odd number of coefficients.

12. The method of claim 6, wherein the symmetrical filter comprises even number of coefficients.

13. The method of claim 12, wherein the left initial subset comprises the center of the filtered string, wherein loading the right initial subset into the right data register comprises loading the center of the fileted string into the right data register, and shifting data elements in the right data register and in the right reservoir register by one element to the left, wherein the right reservoir register feeds the right data register, and wherein loading the next right-side data elements into the right reservoir register comprises shifting the loaded data elements in the right reservoir register by one element to the left, wherein the right reservoir register feeds the right data register.

14. The method of claim 6, further comprising:

calculating an address of the right-side data elements based on an address of the left side data element, a width of the memory, a size of a memory element and a stride length parameter, wherein the stride length parameter is modified by one for subsequent load cycles of the input string, wherein the stride length parameter is indicative of the number of memory rows separating the left-side data elements and the right-side data elements.

15. A system for symmetrical filtering of an input string, the system comprising:

a memory unit comprising a plurality of individually addressable memory banks for sequentially storing the input string;

at least one vector register; and an execution unit configured to read in a single read cycle a subset of right-side data elements and a subset of left-side data elements of the data string to into the at least one vector register, wherein the right-side data elements and the left-side data elements are equally distant from the center of the input string, wherein the memory comprises a plurality of individually addressable memory banks, wherein each data element of the subset of right-side data elements and the subset of left-side data elements is loaded from a different memory bank.

16. The system of claim 15, wherein the memory is a tightly-coupled memory (TCM).

17. The system of claim 15, the execution unit is further configured to:

calculate an address of the right-side data elements based on an address of the left side data element, a width of the memory, the size of a memory element, and a stride length parameter, wherein the stride length parameter is indicative of the number of memory rows separating the subset of left-side data elements and the subset of right-side data elements.

18. The system of claim 15, the execution unit is further configured to:

perform filtering of the input string using a symmetrical filter with the loaded right-side data elements and left-side data elements.

* * * * *